(12) United States Patent  
Yoo et al.

(10) Patent No.: US 9,305,895 B2  
(45) Date of Patent: Apr. 5, 2016

(54) SUBSTRATES HAVING BALL LANDS, SEMICONDUCTOR PACKAGES INCLUDING THE SAME, AND METHODS OF FABRICATING SEMICONDUCTOR PACKAGES INCLUDING THE SAME

(71) Applicant: SK hynix Inc., Icheon-si (KR)

(72) Inventors: Jong Woo Yoo, Seoul (KR); Qwan Ho Chung, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/262,537

(22) Filed: Apr. 25, 2014

(65) Prior Publication Data

US 2015/0145131 A1    May 28, 2015

(30) Foreign Application Priority Data

Nov. 25, 2013 (KR) .......................... 10-2013-0144115

(51) Int. Cl.
*H01L 23/00* (2006.01)
*H05K 1/11* (2006.01)
(Continued)

(52) U.S. Cl.
CPC .......... *H01L 24/81* (2013.01); *H01L 23/49827* (2013.01); *H05K 1/113* (2013.01); *H01L 23/3128* (2013.01); *H01L 23/49816* (2013.01); *H01L 24/05* (2013.01); *H01L 24/16* (2013.01); *H01L 24/32* (2013.01); *H01L 24/48* (2013.01); *H01L 24/85* (2013.01); *H01L 2224/0401* (2013.01); *H01L 2224/05624* (2013.01); *H01L 2224/05647* (2013.01); *H01L 2224/16237* (2013.01); *H01L 2224/32225* (2013.01); *H01L 2224/48225* (2013.01); *H01L 2224/81191* (2013.01); *H01L 2224/81447* (2013.01); *H01L 2224/85181* (2013.01); *H01L 2224/85447* (2013.01); *H01L 2924/00014* (2013.01); *H01L 2924/12042* (2013.01); *H01L 2924/1304* (2013.01); *H01L 2924/14* (2013.01); *H01L 2924/181* (2013.01); *H05K 3/4007* (2013.01); *H05K 2201/09663* (2013.01); *H05K 2203/1178* (2013.01)

(58) Field of Classification Search
CPC ......... H01L 24/81; H01L 24/11; H01L 24/06; H01L 24/17; H01L 2924/14; H01L 2924/1304; H01L 2224/0401; H01L 2224/05026; H01L 2224/16227; H01L 2224/81801; H01L 2924/40252
USPC ........... 257/738, 779, 737, 778, 668; 438/125
See application file for complete search history.

(56) References Cited

U.S. PATENT DOCUMENTS 5,253,526 A * 10/1993 Omura et al. ............... 73/514.16
2003/0057569 A1 * 3/2003 Wakamiya et al. ........... 257/780
(Continued)

FOREIGN PATENT DOCUMENTS

JP           11-17091 A  *  1/1999
JP       2004-247427 A  *  9/2004
(Continued)

*Primary Examiner* — Alexander Oscar Williams

(57) ABSTRACT

A package substrate includes a core layer having a first surface and a second surface which are opposite to each other, a ball land pad disposed on the first surface of the core layer, an opening that penetrates the core layer to expose the ball land pad, and a dummy ball land disposed on the second surface of the core layer to surround the opening. The dummy ball land includes at least one sub-pattern and at least one vent hole. Related semiconductor packages and related methods are also provided.

19 Claims, 12 Drawing Sheets

(51) Int. Cl.
*H01L 23/31* (2006.01)
*H01L 23/498* (2006.01)
*H05K 3/40* (2006.01)

(56) References Cited

U.S. PATENT DOCUMENTS

| | | | |
|---|---|---|---|
| 2007/0101571 A1* | 5/2007 | Kataoka et al. | 29/829 |
| 2009/0191730 A1* | 7/2009 | Ito et al. | 439/83 |
| 2011/0042828 A1* | 2/2011 | Sota et al. | 257/774 |
| 2011/0074026 A1* | 3/2011 | Shim et al. | 257/737 |

FOREIGN PATENT DOCUMENTS

| | | | |
|---|---|---|---|
| JP | 2006-169508 A | * | 6/2006 |
| JP | 2009-10437 A | * | 1/2009 |
| KR | 10-2001-0060876 A | | 7/2001 |
| KR | 10-2006-0016217 A | | 2/2006 |
| KR | 10-0764055 B1 | | 9/2007 |
| KR | 10-2011-0028939 A | | 3/2011 |

* cited by examiner

US 9,305,895 B2

SUBSTRATES HAVING BALL LANDS, SEMICONDUCTOR PACKAGES INCLUDING THE SAME, AND METHODS OF FABRICATING SEMICONDUCTOR PACKAGES INCLUDING THE SAME

CROSS-REFERENCE TO RELATED APPLICATION

The present application claims priority under 35 U.S.C. 119(a) to Korean Patent Application No. 10-2013-0144115, filed on Nov. 25, 2013, in the Korean Intellectual Property Office, which is incorporated herein by reference in its entirety as set forth in full.

BACKGROUND

1. Technical Field

Embodiments of the present disclosure relate to semiconductor packages and, more particularly, to substrates having ball lands, semiconductor packages including the same, and methods of fabricating semiconductor packages including the same.

2. Related Art

Electronic devices employed in electronic systems may include various active circuit elements and various passive circuit elements. Active and passive circuit elements may be integrated in and/or on a semiconductor substrate to constitute an electronic device (also referred to as a semiconductor chip or a semiconductor die). Electronic devices composed of integrated circuits may be attached to or mounted on package substrates that include interconnections and may be encapsulated to provide semiconductor packages. Semiconductor packages may be mounted on printed circuit boards (PCBs) to produce electronic systems such as computers, mobile systems, or data storage media.

When a semiconductor chip is electrically coupled to a package substrate, or a semiconductor chip is electrically coupled to another semiconductor chip, solder balls or solder bumps may be applied as an interconnection structure.

SUMMARY

Various embodiments are directed to substrates having ball lands, semiconductor packages including the same, and methods of fabricating semiconductor packages including the same.

In an embodiment, a substrate includes a core layer having a first surface and a second surface which are opposite to each other, a ball land pad on the first surface of the core layer, an opening that penetrates the core layer to expose the ball land pad, a first dummy ball land disposed on the second surface of the core layer to surround the opening and to include at least one sub-pattern, and at least one first vent hole penetrating the at least one sub-pattern in a horizontal direction parallel with the second surface of the core layer.

In an embodiment, a semiconductor package includes a core layer having a first surface and a second surface which are opposite to each other, a ball land pad on the first surface of the core layer, an opening that penetrates the core layer to expose the ball land pad, a first dummy ball land disposed on the second surface of the core layer to surround the opening and to include at least one sub-pattern, at least one first vent hole penetrating the at least one sub-pattern in a horizontal direction parallel with the second surface of the core layer, a solder mask pattern on the core layer to expose the opening, and a semiconductor chip attached onto the solder mask pattern and electrically connected to the ball land pad. The core layer, the ball land pad and the first dummy ball land constitute a substrate.

In an embodiment, a method of fabricating a semiconductor package includes providing a substrate. The substrate includes a core layer having a first surface and a second surface opposite to each other, a ball land pad on the first surface of the core layer, an opening penetrating the core layer to expose the ball land pad, a first dummy ball land disposed on the second surface to surround the opening and to include at least one sub-pattern, and at least one first vent hole laterally crossing a portion of the at least one sub-pattern. A solder mask pattern is formed on the substrate to expose the opening. A semiconductor chip is attached onto the substrate. The semiconductor chip is electrically connected to the substrate. An external terminal is formed on the first dummy ball land to fill the opening.

In an embodiment, a semiconductor package includes a substrate, a solder mask pattern and a semiconductor chip. The substrate includes a core layer having a first surface and a second surface opposite to each other, a ball land pad on the first surface of the core layer, an opening penetrating the core layer to expose the ball land pad, a dummy ball land disposed on the second surface to surround the opening and to include at least one sub-pattern, and at least one first vent hole laterally crossing a portion of the at least one sub-pattern. The solder mask pattern is disposed on the second surface of the core layer to expose the opening and the at least one sub-pattern. The semiconductor chip is attached to the substrate and electrically connected to the substrate.

BRIEF DESCRIPTION OF THE DRAWINGS

Embodiments will become more apparent in view of the attached drawings and accompanying detailed description.

DESCRIPTION OF SPECIFIC EMBODIMENTS

Figure 1A:
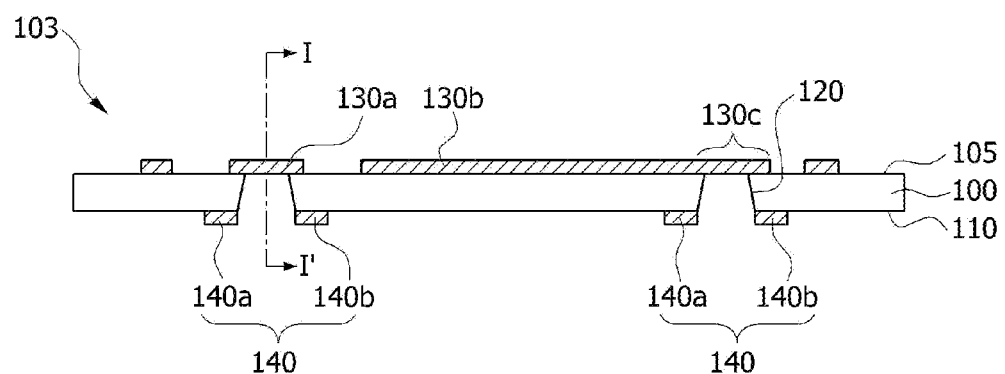
FIG. 1A is a cross-sectional view illustrating a substrate according to an embodiment.
Figure 1B:
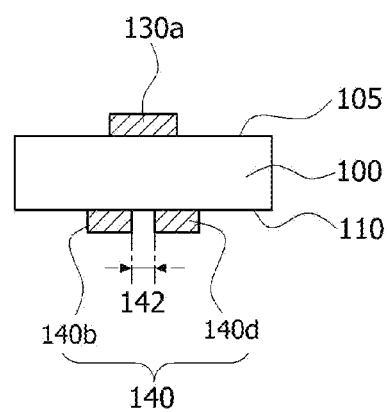
FIG. 1B is a side cross-sectional view taken along a line I-I' of FIG. 1A.
Figure 1C:
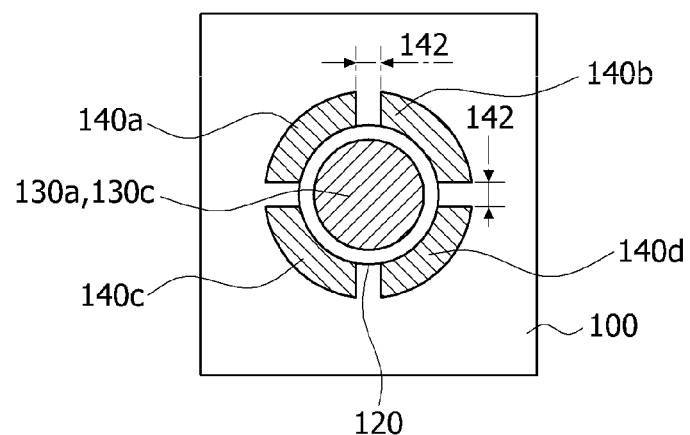
FIG. 1C is a plan view illustrating a dummy ball land suitable for the substrate of FIG. 1A according to an embodiment.

Referring to FIGS. 1A, 1B, and 1C, a substrate 103 according to an embodiment includes a core layer 100 having a first surface 105 and a second surface 110 which are opposite to each other, a first ball land pad 130a disposed on the first surface 105 of the core layer 100, a first circuit interconnection pattern 130b disposed on the first surface 105 of the core layer 100, a second ball land pad 130c disposed on the first surface 105 of the core layer 100, and openings 120 penetrating the core layer 100 to expose the first and second ball land pads 130a and 130c. The second ball land pad 130c may correspond to a portion that extends from an end of the first circuit interconnection pattern 130b.

The substrate 103 may be a package substrate on which a semiconductor chip (not shown) may be mounted. The first circuit interconnection pattern 130b may be used to electrically couple the substrate 103 to the semiconductor chip mounted on the substrate 103. The first circuit interconnection pattern 130b may include a conductive material, for example, a copper material. In some embodiments, each of the openings 120 penetrating the core layer 100 may have a sloped sidewall such that a horizontal cross-sectional area of each opening 120 is gradually reduced from the second surface 110 of the core layer 100 toward the first surface 105 of the core layer 100. In another embodiment, although not shown in the drawings, each of the openings 120 penetrating the core layer 100 may have a vertical sidewall such that a horizontal cross-sectional area of each opening 120 is constant or uniform regardless of a level of a horizontal cross section of the opening 120. The opening 120 exposes a surface of the first ball land pad 130a and a surface of the second ball land pad 130c, the surfaces of the first and second ball land pads 130a and 130c border on the first surface 105 of the core layer 100.

Dummy ball lands 140 may be disposed on the second surface 110 of the core layer 100 opposite each of the first and second ball land pads 130a and 130c. In some embodiments, each of the dummy ball lands 140 includes a plurality of sub-patterns 140a, 140b, 140c, and 140d which are disposed to surround a corresponding one of the openings 120 in a plan view. That is, as illustrated in FIG. 1C, the sub-patterns 140a, 140b, 140c, and 140d may correspond to four separate portions of a ring that surrounds the corresponding opening 120.

Vent holes 142 may be disposed between the sub-patterns 140a, 140b, 140c, and 140d. That is, the sub-patterns 140a, 140b, 140c, and 140d are separated from each other by the vent holes 142. The vent holes 142 penetrates the at least one sub-pattern in a horizontal direction parallel with the second surface 110 of the core layer 100. In an embodiment, the first sub-pattern 140a may be disposed to have a point symmetric configuration to the fourth sub-pattern 140d and the second sub-pattern 140b may be disposed to have a point symmetric configuration to the third sub-pattern 140c to minimize solder ball joint stress when solder balls (not shown) are mounted on ball lands, when viewed from a plan view.

However, an arrangement of the first through fourth sub-patterns 140a, 140b, 140c, and 140d is not limited to the above-described configuration.

Although FIG. 1C illustrates an embodiment in which the vent holes 142 between the first through fourth sub-patterns 140a, 140b, 140c, and 140d have substantially the same width, embodiments are not limited thereto. In another embodiment, widths of the vent holes 142 between the first through fourth sub-patterns 140a, 140b, 140c, and 140d may be different from each other.

The first and second ball land pads 130a and 130c may include a conductive material, for example, a copper material, a nickel material, or a gold material. The sub-patterns 140a, 140b, 140c, and 140d constituting each of the dummy ball lands 140 may include a wetting material for the solder balls. The sub-patterns 140a, 140b, 140c, and 140d may include a copper material, a nickel material, or a gold material.

Although FIG. 1C illustrates an embodiment in which the number of the sub-patterns 140a, 140b, 140c, and 140d constituting each of the dummy ball lands 140 is four, embodiments are not limited thereto. That is, in some embodiments, each of the dummy ball lands 140 may include two, three, five, or more sub-patterns. In any case, sub-patterns of each of dummy ball lands 140 may be separated from each other by vent holes such as the vent holes 142.

Figure 1D:
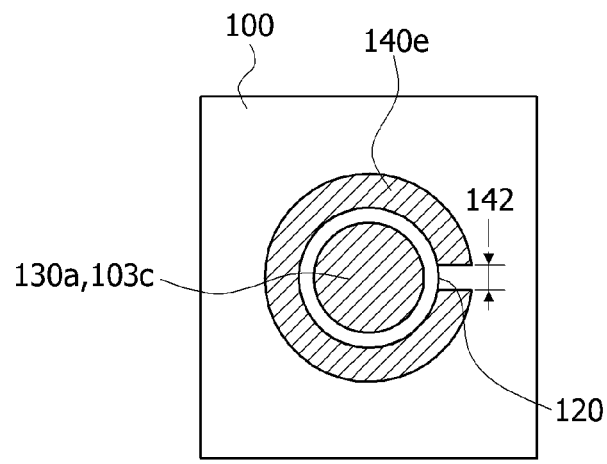
FIG. 1D is a plan view illustrating a dummy ball land suitable for the substrate of FIG. 1A according to another embodiment.

In another embodiment, each of the dummy ball lands 140 may have a single sub-pattern 140e, as illustrated in FIG. 1D. In such a case, the single sub-pattern 140e may have a "C"-shaped configuration surrounding the opening 120, in a plan view. If each of the dummy ball lands 140 has the single sub-pattern 140e, a single vent hole 142 may be disposed between one end of the single sub-pattern 140e and the other end of the single sub-pattern 140e.

According to the above embodiments, solder balls (not shown) may be mounted on respective ones of the openings 120, and the solder balls may be reflowed to completely fill the openings 120. As a result, the solder balls may be bonded to the first and second ball land pads 130a and 130c as well as to the dummy ball lands 140. While the solder balls are reflowed to fill the openings 120, voids may be generated in the solder balls. However, the voids generated in the solder balls may be easily removed through the vent holes 142. That is, the vent holes 142 may prevent the voids generated in the solder balls from being trapped in the solder balls. Because the vent holes 142 suppress generation of the voids in the solder balls, the reliability of the semiconductor package may be improved.

Figure 2A:
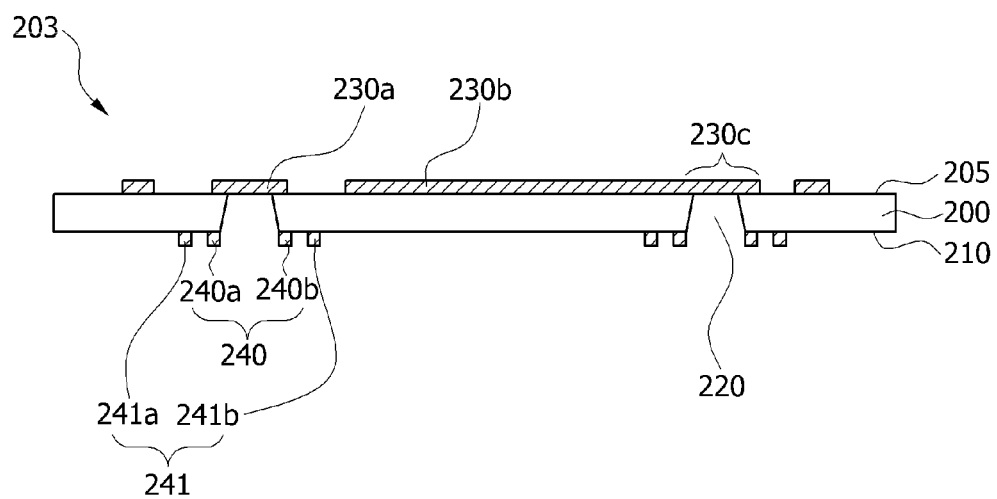
FIG. 2A is a cross-sectional view illustrating a substrate according to another embodiment.
Figure 2B:
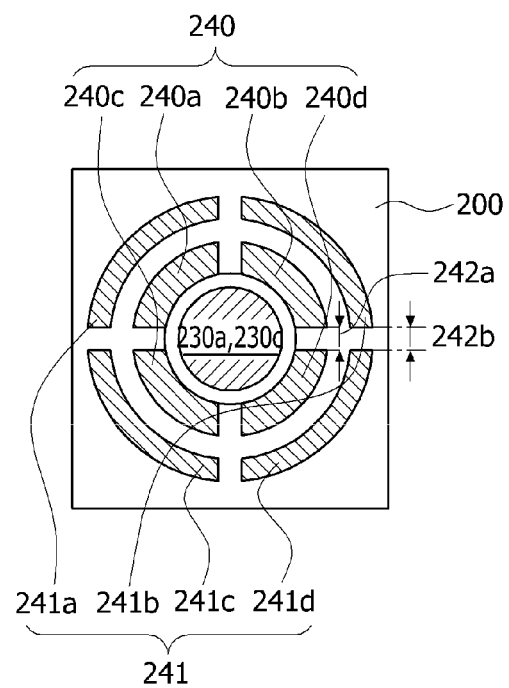
FIG. 2B is a plan view illustrating a dummy ball land of FIG. 2A according to an embodiment.

Referring to FIGS. 2A and 2B, a substrate 203 according to another embodiment includes a core layer 200 having a first surface 205 and a second surface 210 which are opposite to each other, a first ball land pad 230a disposed on the first surface 205 of the core layer 200, a first circuit interconnection pattern 230b disposed on the first surface 205 of the core layer 200, a second ball land pad 230c disposed on the first surface 205 of the core layer 200, and openings 220 penetrating the core layer 200 to expose the first and second ball land pads 230a and 230c. The first circuit interconnection pattern 230b may be used to electrically couple the substrate 203 to a semiconductor chip (not shown) which may be mounted on the substrate 203. The second ball land pad 230c may correspond to a portion that extends from an end of the first circuit interconnection pattern 230b.

Dummy ball lands may be disposed on the second surface 210 of the core layer 200 opposite each of the first and second ball land pads 230a and 230c. The dummy ball lands may be disposed to surround each of the openings 220 when viewed from a plan view. Each of the dummy ball lands may include a first dummy ball land 240 surrounding one of the openings 220 and a second dummy ball land 241 surrounding the first dummy ball land 240. The second dummy ball land 241 may be disposed to be spaced apart from the first dummy ball land 240 by a predetermined distance. The first dummy ball land 240 may include a plurality of sub-patterns 240a, 240b, 240c, and 240d, and the second dummy ball land 241 may also include a plurality of sub-patterns 241a, 241b, 241c, and 241d.

As illustrated in FIG. 2B, the sub-patterns 240a, 240b, 240c, and 240d of the first dummy ball land 240 may correspond to four separate portions constituting a ring that surrounds each of the openings 220. First vent holes 242a may be disposed between the sub-patterns 240a, 240b, 240c, and 240d of the first dummy ball land 240. Similarly, second vent holes 242b may be disposed between the sub-patterns 241a, 241b, 241c, and 241d of the second dummy ball land 241. The sub-patterns 240a, 240b, 240c, and 240d of the first dummy ball land 240 may be disposed on an inner circular line, and the sub-patterns 241a, 241b, 241c, and 241d of the second dummy ball land 241 may be disposed on an outer circular line. Each of the sub-patterns 240a, 240b, 240c, and 240d of the first dummy ball land 240 and each of the sub-patterns 241a, 241b, 241c, and 241d of the second dummy ball land 241 may disposed to have a radial form. The first vent holes 242a or the second vent holes 242b penetrate the at least one sub-pattern in a horizontal direction parallel with the second surface 210 of the core layer 200.

Although FIG. 2B illustrates an embodiment in which the vent holes 242a and 242b have substantially the same width, embodiments are not limited thereto. That is, in some embodiments, a width of the vent holes 242a may be different from a width of the vent holes 242b. A space between the first and second dummy ball lands 240 and 241 may expose a portion of the core layer 200 formed of an insulation layer. As a result, even though solder balls (not shown) are mounted on the openings 220 and the solder balls are reflowed to fill the openings 220, the solder balls may not be metallurgically bonded to the core layer 200 between the first and second dummy ball lands 240 and 241.

FIGS. 3 through 13C are schematic views illustrating a method of fabricating a semiconductor package according to an embodiment.

Figure 3:
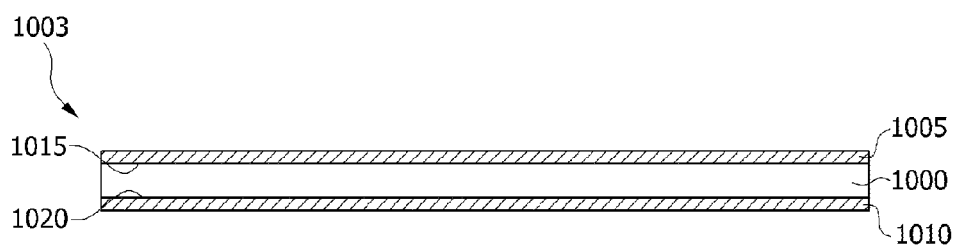
FIGS. 3 through 13C are schematic views illustrating a method of fabricating a semiconductor package according to an embodiment.

Referring to FIG. 3, a substrate 1003 is provided. The substrate 1003 is formed by bonding a first conductive layer 1005 and a second conductive layer 1010 to a first surface 1015 and a second surface 1020 of a core layer 1000, respectively. The core layer 1000 may include one or more insulation layers. The first and second conductive layers 1005 and 1010 may include a copper material. The first and second conductive layers 1005 and 1010 may be bonded to the core layer 1000 by applying pressure to the first and second conductive layers 1005 and 1010 at a predetermined temperature.

Figure 4A:
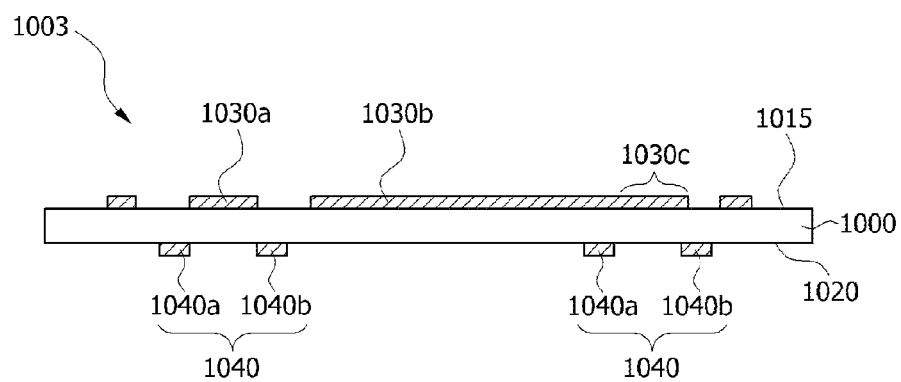
Figure 4B:
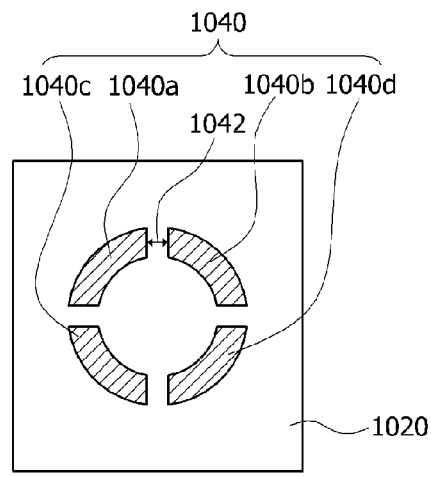

FIG. 4A shows the substrate 1003 after patterning of the first and second conductive layers 1005 and 1010. FIG. 4B is a plan view illustrating a dummy ball land of FIG. 4A. Referring to FIGS. 4A and 4B, the first conductive layer 1005 is patterned to form a first ball land pad 1030a, a first circuit interconnection pattern 1030b, and a second ball land pad 1030c on the first surface 1015 of the core layer 1000. The second ball land pad 1030c may be formed to extend from an end of the first circuit interconnection pattern 1030b.

The second conductive layer 1010 is patterned to form dummy ball lands 1040 on the second surface 1020 of the core layer 1000. Referring to FIG. 4B, each of the dummy ball lands 1040 is formed to include a plurality of sub-patterns 1040a, 1040b, 1040c, and 1040d. The sub-patterns 1040a, 1040b, 1040c, and 1040d of the dummy ball land 1040 may be formed to surround each opening which may be formed in a subsequent process. Spaces between the sub-patterns 1040a, 1040b, 1040c, and 1040d may act as vent holes 1042.

Figure 5:
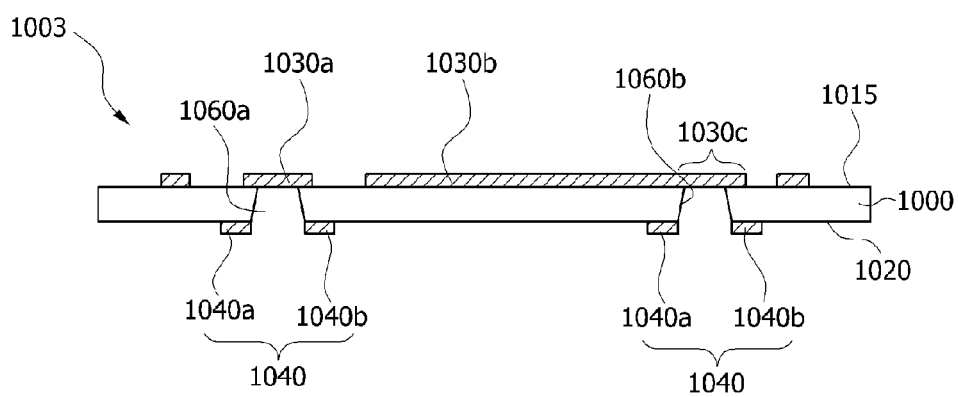

Referring to FIG. 5, the core layer 1000 of the substrate 1003 is patterned to form a first opening 1060a and a second opening 1060b that expose the first and second ball land pads 1030a and 1030c, respectively. The first and second openings 1060a and 1060b may be formed by patterning the core layer 1000 using a mechanical drilling process or a laser drilling process. When the first and second openings 1060a and 1060b are formed using a laser drilling process, the laser drilling process may be performed using a carbon dioxide ($CO_2$) laser. When the first and second openings 1060a and 1060b are formed using a laser drilling process, a laser beam may be irradiated onto portions of the second surface 1020 of the core layer 1000 surrounded by the dummy ball lands 1040 to etch the core layer 1000 until the first and second ball land pads 1030a and 1030c are exposed. While the core layer 1000 is patterned using a carbon dioxide ($CO_2$) laser to form the first and second openings 1060a and 1060b, the dummy ball lands 1040 may act as barrier layers similar to etch stop layers.

Each of the first and second openings 1060a and 1060b penetrating the core layer 1000 may be formed to have a sloped sidewall such that a horizontal cross-sectional area of each opening 1060a or 1060b is gradually reduced from the second surface 1020 of the core layer 1000 toward the first surface 1015 of the core layer 1000. In another embodiment, although not shown in the drawings, each of the first and second openings 1060a and 1060b penetrating the core layer 1000 may be formed to have a vertical sidewall such that a horizontal cross-sectional area of each opening 1060a or 1060b is constant or uniform regardless of a level of a horizontal cross section of the opening 1060a or 1060b.

As a result of formation of the openings 1060a and 1060b, each of the dummy ball lands 1040 may be disposed surrounding the first or second opening 1060a or 1060b. The sub-patterns 1040a, 1040b, 1040c, and 1040d of each dummy ball land 1040 may be formed separated from each other. That is, the sub-patterns 1040a, 1040b, 1040c, and 1040d of each dummy ball land 1040 are formed to have spaces therebetween, the spaces corresponding to the vent holes 1042 shown in FIG. 4B. The vent holes 1042 will be described more fully later on.

Figure 6:
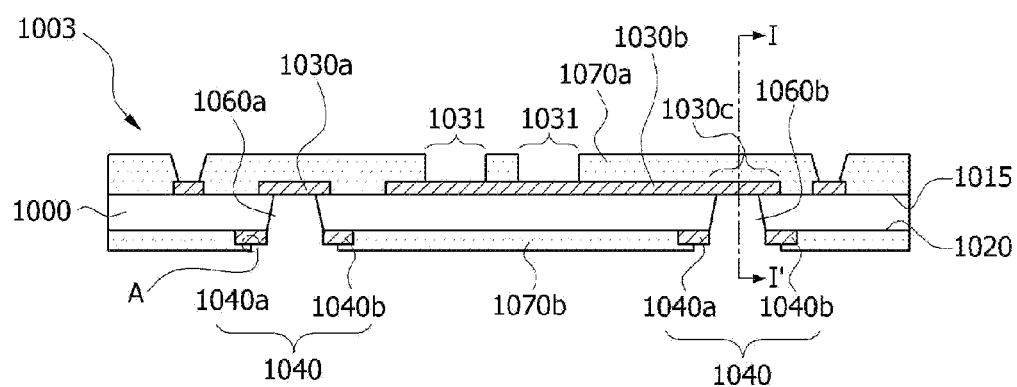
Figure 7:
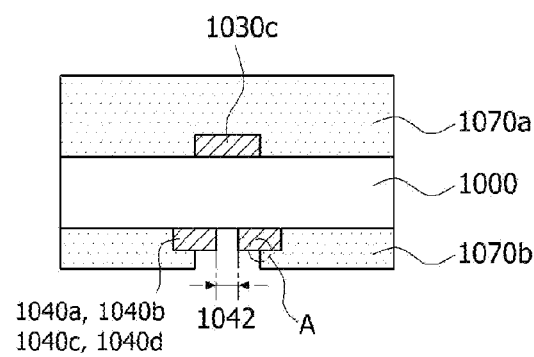

FIG. 6 shows the substrate 1003 having first and second solder mask patterns 1070a and 1070b formed thereon. FIG. 7 is a side cross-sectional view taken along a line I-I' of FIG. 6, and FIG. 8 is a plan view illustrating an opening and a dummy ball land of FIG. 6.

Figure 8:
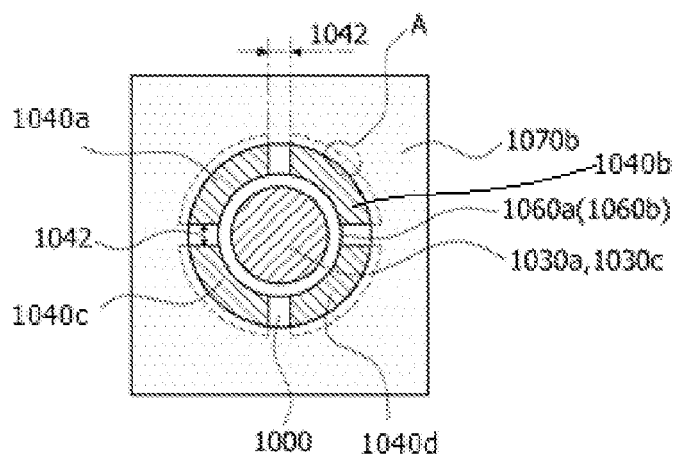

Referring to FIGS. 6, 7 and 8, the solder mask patterns 1070a and 1070b are formed on the substrate 1003 that includes the first and second openings 1060a and 1060b. Specifically, solder resist layers may be formed on the substrate 1003. The solder resist layers may be formed by coating the substrate 1003 with a solder resist ink having fluidity, using, for example, spin coating. The solder resist layers may include an insulation material and may protect the substrate 1003 from chemical solutions and/or physical force. The solder resist layers may include an organic material or an inorganic material that includes a polymer material. An exposure process and a developing process, for example, a photolithographic process, may be applied to the solder resist layers to form the first solder mask pattern 1070a and the second solder mask pattern 1070b. The first solder mask pattern 1070a is formed on the first surface 1015 of the core layer 1000, and portions of the first circuit interconnection pattern 1030b are exposed by the first solder mask pattern 1070a to form bonding pads 1031. The second solder mask pattern 1070b is formed on the second surface 1020 of the core layer 1000 to expose the first and second openings 1060a and 1060b and the dummy ball lands 1040.

The first and second solder mask patterns 1070a and 1070b may be formed to have a solder mask defined (SMD) type structure. The SMD type structure means that actual ball land portions, that is, portions of the ball lands that may bond to the solder balls, are defined by the solder mask patterns because the solder mask patterns are formed to cover edges of the ball lands. In an embodiment, the second solder mask pattern 1070b may be formed to expose all of the first and second openings 1060a and 1060b, but the second solder mask pattern 1070b may be formed to cover edges (see portions "A" of FIGS. 6, 7 and 8) of the dummy ball lands 1040. Thus, the exposed portions of the dummy ball lands 1040 may be defined by the second solder mask pattern 1070b.

Although not shown in FIGS. 6 through 8, in some embodiments, the first and second solder mask patterns 1070a and 1070b may be formed to have a non-solder mask defined (NSMD) type structure. The NSMD type structure means that entire surfaces of the ball lands are exposed when the solder mask pattern is formed. That is, when the second solder mask pattern 1070b is formed to have the NSMD type structure, the entire surfaces of the dummy ball lands 1040 are exposed.

Referring again to FIGS. 7 and 8, the sub-patterns 1040a, 1040b, 1040c, and 1040d of each dummy ball land 1040 may be formed to correspond to four separate sections constituting a ring. In an embodiment, the first sub-pattern 1040a may be disposed to have a point symmetric configuration to the fourth sub-pattern 1040d for minimizing stress on solder balls (not shown) and the second sub-pattern 1040b may be disposed to have a point symmetric configuration to the third sub-pattern 1040c for minimizing stress on solder balls, when viewed from a plan view. Spaces between the sub-patterns 1040a, 1040b, 1040c, and 1040d may act as the vent holes 1042 exposing portions of the second surface 1020 of the core layer 1000. In an embodiment, the second solder mask pattern 1070b may be formed to have the SMD type structure, as illustrated in FIGS. 6, 7 and 8. Thus, the second solder mask pattern 1070b may be formed to cover edges of the sub-patterns 1040a, 1040b, 1040c, and 1040d.

Figure 9:
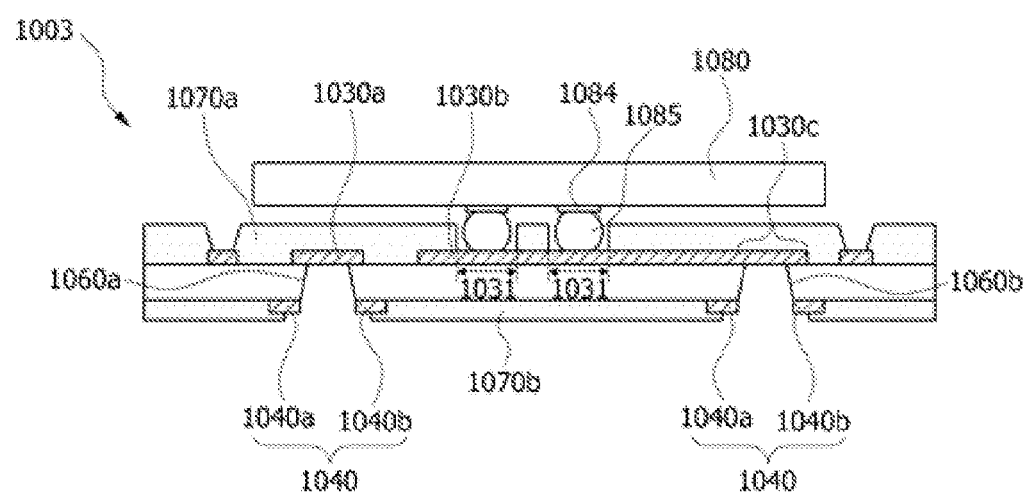

Referring to FIG. 9, a semiconductor chip 1080 is attached onto the substrate 1003 including the solder mask patterns 1070a and 1070b. The semiconductor chip 1080 may be formed to include active elements such as transistors. The semiconductor chip 1080 may also be formed to include passive elements such as capacitors and/or resistors in addition to the active elements. The semiconductor chip 1080 may include electrode pads (not shown) disposed on two opposite ends thereof.

The semiconductor chip 1080 includes connection pads 1084 that are disposed on a body thereof to electrically couple the semiconductor chip 1080 to the substrate 1003. The connection pads 1084 may be formed including a conductive material, for example, an aluminum material or a copper material. The semiconductor chip 1080 is attached onto the substrate 1003 using connection terminals 1085 formed on the connection pads 1084 as connection media. The connection terminals 1085 may be bumps and may be attached to the respective bonding pads 1031 of the substrate 1003.

Although not shown in the drawings, in some embodiments, the semiconductor chip 1080 may be attached onto the substrate 1003 using an adhesive layer, or conductive wires may be formed to electrically couple the semiconductor chip 1080 to the substrate 1003. The conductive wires may be formed using a wire bonding process. In such a case, first ends of the conductive wires may be bonded to electrode pads formed on a top surface of the semiconductor chip 1080, and second ends of the conductive wires may be bonded to the first circuit interconnection pattern 1030b of the substrate 1003.

Figure 10:
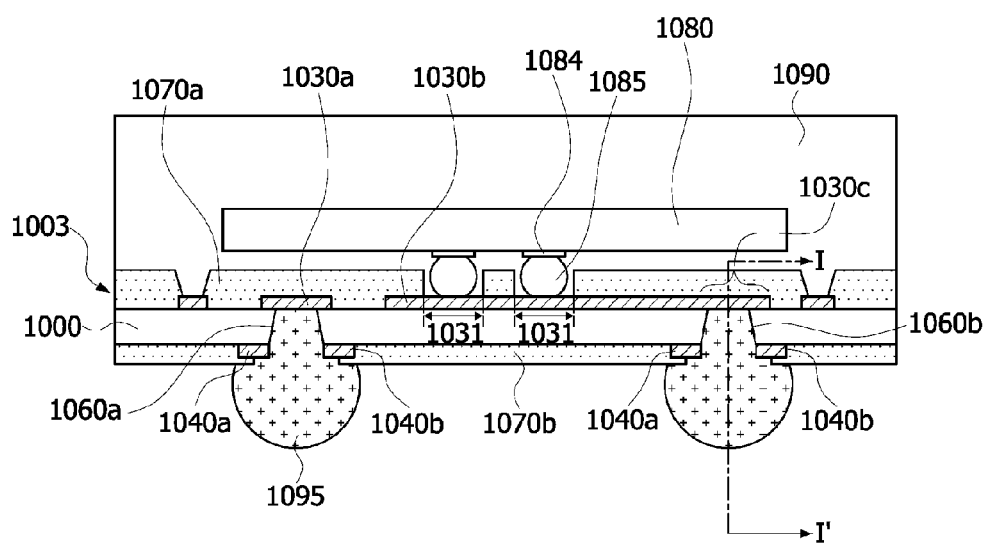
Figure 11:
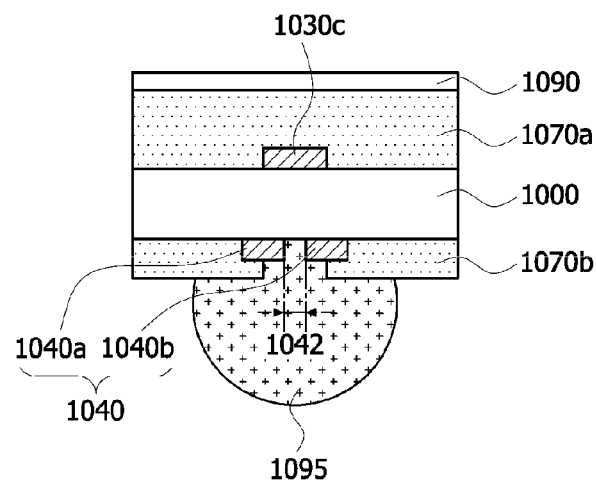

FIG. 10 shows the substrate 1003 having a molding resin layer 1090 and solder balls 1095 formed thereon. FIG. 11 is a side cross-sectional view taken along a line I-I' of FIG. 10, and FIG. 12 is a plan view illustrating a solder ball together with the ball land structure of FIG. 10.

Figure 12:
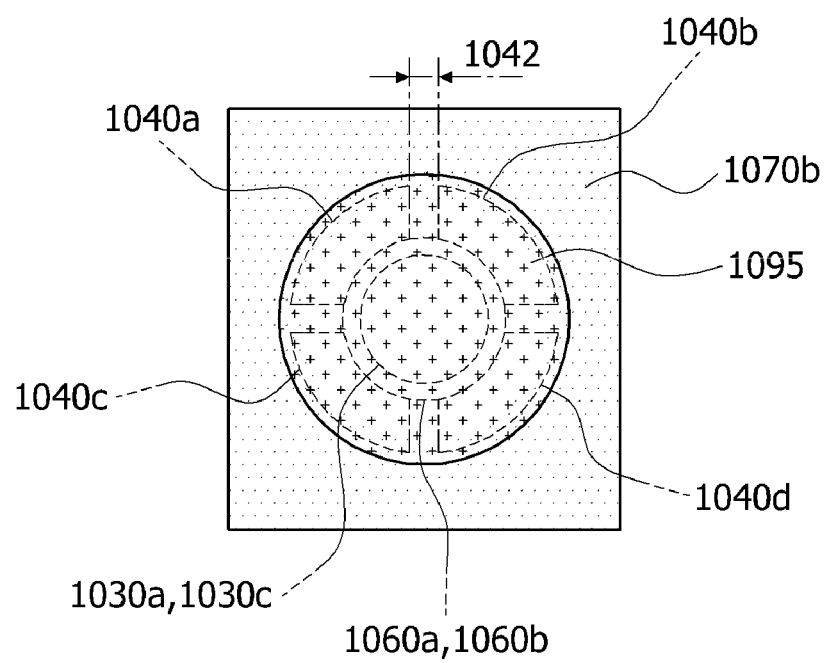

Referring to FIGS. 10, 11 and 12, the molding resin layer 1090 is formed on the substrate 1003 to encapsulate the semiconductor chip 1080 using a molding process. The molding resin layer 1090 may include an epoxy material. The molding resin layer 1090 may be formed to cover the semiconductor chip 1080 and the substrate 1003.

Subsequently, the solder balls 1095 filling the first and second openings 1060a and 1060b are formed. The solder balls 1095 may correspond to external terminals for electrically coupling the semiconductor chip 1080 to an external device. The solder balls 1095 may be formed by providing spherical solder balls on each of the openings 1060a and 1060b exposing the ball land pads 1030a and 1030c and reflowing the spherical solder balls. In another embodiment, the solder balls 1095 may be formed by reflowing solder pillars. The solder pillars may be formed using a plating process or a stencil printing process.

Referring to FIGS. 11 and 12, the solder balls 1095 are formed filling the vent holes 1042 between the sub-patterns 1040a, 1040b, 1040c, and 1040d of each of the dummy ball lands 1040. That is, the solder balls 1095 may be formed filling the vent holes 1042 and the openings 1060a and 1060b as well as formed adhering to the sub-patterns 1040a, 1040b, 1040c, and 1040d. Thus, an adhesion strength between the solder balls 1095 and the ball land pads 1030a and 1030b and dummy ball lands 1040 may be improved. In addition, during the reflow process for forming the solder balls 1095, voids generated in the solder balls 1095 may be vented out through the vent holes 1042 prior to the vent holes 1042 being finally filled by the solder balls 1095. Thus, generation of the voids in the solder balls 1095 may be suppressed due to the presence of the vent holes 1042. As a result, the contact reliability of the solder balls 1095 may be improved.

If the dummy ball lands 1040 are formed without the vent holes 1042, voids generated in the solder balls 1095 may still be trapped in the solder balls 1095 even after the reflow process. These voids may cause contact failures between the solder balls 1095 and the dummy ball lands 1040 (or the first and second ball land pads 1030a and 1030c) and may degrade the reliability of the semiconductor package. However, according to the embodiments, the solder balls 1095 may be formed to fill the vent holes 1042 and the openings 1060a and 1060b as well as to adhere to the sub-patterns 1040a, 1040b, 1040c and 1040d. Thus, an adhesive strength between the solder balls 1095, the ball land pads 1030a and 1030b, and the dummy ball lands 1040 may be improved. In addition, during the reflow process for forming the solder balls 1095, voids generated in the solder balls 1095 may be easily vented out through the vent holes 1042 and the vent holes 1042 may be completely filled with the solder balls 1095. Thus, the vent holes 1042 suppress the generation of the voids in the solder balls 1095, resulting in the improvement of the contact reliability of the solder balls 1095. In some embodiments, during the reflow process for forming the solder balls 1095, voids generated in the solder balls 1095 may be easily vented out through the vent holes 1042 and the vent holes 1042 may be substantially filled with the solder balls 1095.

Figure 13A:
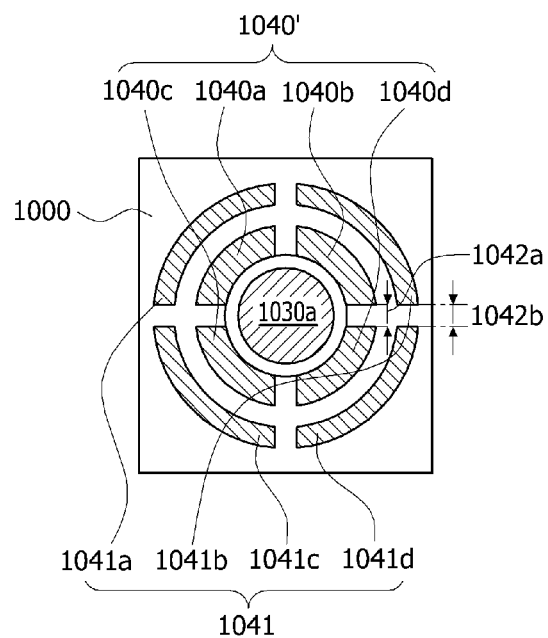
Figure 13B:
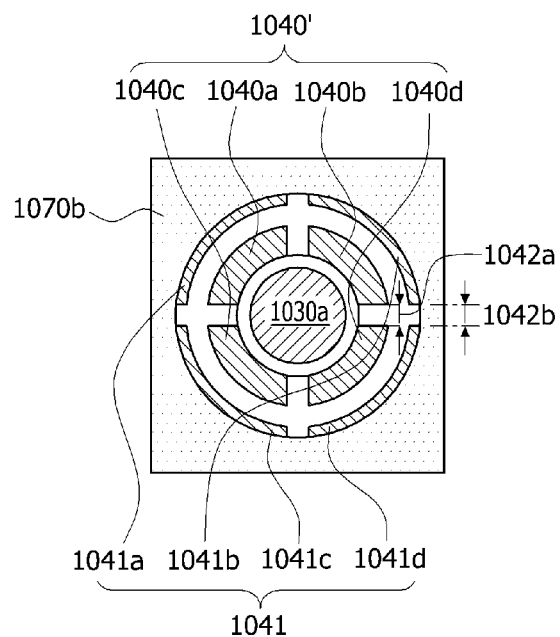
Figure 13C:
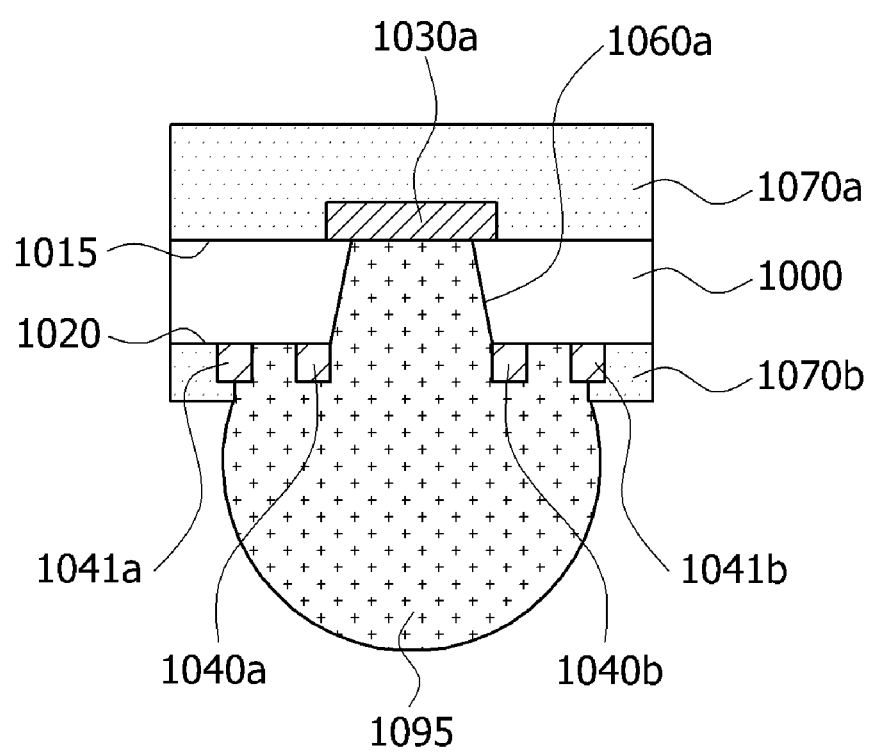

In some embodiments, each of dummy ball lands may be formed to have a multi-ring structure. FIG. 13A is a plan view illustrating a dummy ball land having the multi-ring structure. FIG. 13B is a plan view illustrating the second solder mask pattern 1070b of FIGS. 10, 11 and 12 together with the dummy ball land having the multi-ring structure. FIG. 13C is a cross-sectional view illustrating the solder ball 1095 together with the dummy ball land having the multi-ring structure.

Referring to FIGS. 13A, 13B and 13C, a first dummy ball land 1040' and a second dummy ball land 1041 are formed on the second surface 1020 of the core layer 1000. The first dummy ball land 1040' and the second dummy ball land 1041 may constitute a dummy ball land. The first dummy ball land 1040' is formed surrounding the opening 1060a or 1060b, and the second dummy ball land 1041 is formed surrounding the first dummy ball land 1040'. The first dummy ball land 1040' is formed including a plurality of sub-patterns 1040a, 1040b, 1040c, and 1040d, and the second dummy ball land 1041 is formed including a plurality of sub-patterns 1041a, 1041b, 1041c, and 1041d. Spaces between the sub-patterns 1040a, 1040b, 1040c, and 1040d correspond to first vent holes 1042a, and spaces between the sub-patterns 1041a, 1041b, 1041c, and 1041d correspond to second vent holes 1042b.

When the solder balls 1095 are bonded to the substrate 1003 including the first and second dummy ball lands 1040' and 1041, the solder balls 1095 may be formed to fill the first and second vent holes 1042a and 1042b as well as spaces between the first and second dummy ball lands 1040' and 1041, as illustrated in FIG. 13C. Further, the solder balls 1095 may be formed to fill the first and second openings 1060a and 1060b as well as formed adhering to the sub-patterns 1040a, 1040b, 1040c, 1040d, 1041a, 1041b, 1041c, and 1041d of the first and second dummy ball lands 1040' and 1041. Thus, an adhesion strength between the solder balls 1095 and the ball land pads 1030a and 1030b and dummy ball lands 1040' and 1041 may be improved.

Although the present disclosure describes an embodiment in which the second solder mask pattern 1070b is formed having the SMD type structure in which the second solder mask pattern 1070b covers edges of sub-patterns of a dummy ball land, e.g., the sub-patterns 1041a, 1041b, 1041c, and 1041d of the second dummy ball land 1041, as illustrated in FIG. 13B, embodiments are not limited thereto. That is, in some embodiments, the second solder mask pattern 1070b may be formed to have the NSMD type structure.

Figure 14:
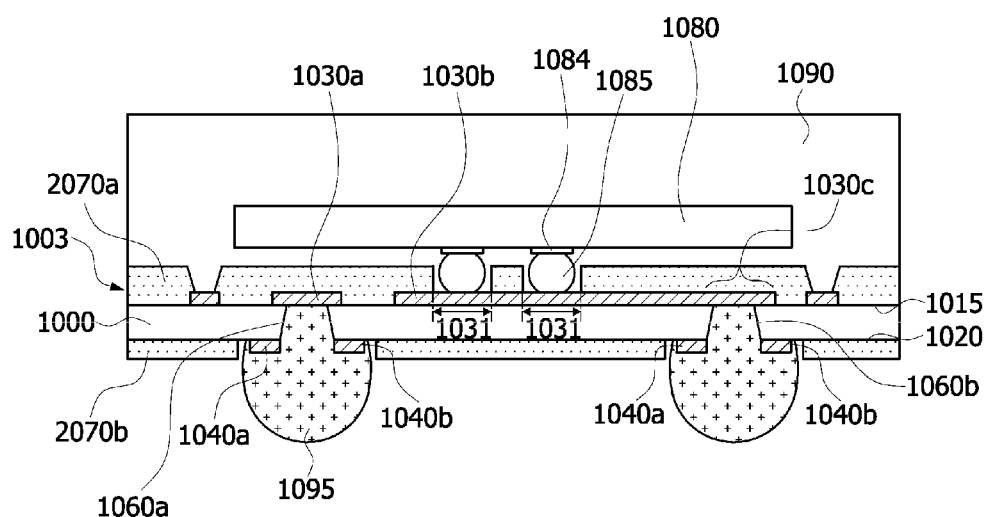
FIG. 14 is a cross-sectional view illustrating a semiconductor package according to an embodiment.
Figure 15:
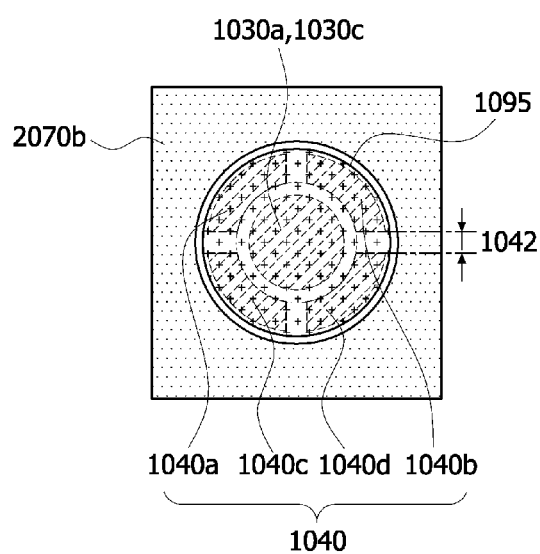
FIG. 15 is a plan view illustrating a dummy ball land and a solder ball of FIG. 14.

FIG. 14 is a cross-sectional view illustrating a semiconductor package including a second solder mask pattern 2070b having the NMSD type structure according to an embodiment, and FIG. 15 is a plan view illustrating a dummy ball land and a solder ball of FIG. 14. In FIGS. 14 and 15, the same components as described in the embodiments of FIGS. 3 to 13C are indicated by the same reference numerals or the same reference designators. Thus, to avoid duplicate explanation, descriptions of the same components as set forth in the previous embodiments will be omitted or briefly mentioned in this embodiment.

Referring to FIGS. 14 and 15, a substrate 1003 includes a core layer 1000 having a first surface 1015 and a second surface 1020 which are opposite to each other, a first ball land pad 1030a disposed on the first surface 1015 of the core layer 1000, a first circuit interconnection pattern 1030b disposed on the first surface 1015 of the core layer 1000, a second ball land pad 1030c disposed on the first surface 1015 of the core layer 1000, and first and second openings 1060a and 1060b penetrating the core layer 1000 to expose the first and second ball land pads 1030a and 1030c. Each of the openings 1060a and 1060b penetrating the core layer 1000 may have a sloped sidewall such that a horizontal cross-sectional area of each opening 1060a or 1060b is gradually reduced from the second surface 1020 of the core layer 1000 toward the first surface 1015 of the core layer 1000. In another embodiment, although not shown in the drawings, each of the openings 1060a and 1060b penetrating the core layer 1000 may have a vertical sidewall such that a horizontal cross-sectional area of each opening 1060a or 1060b is constant or uniform regardless of a level of a horizontal cross section of the opening 1060a or 1060b.

Dummy ball lands 1040 are disposed on the second surface 1020 of the core layer 1000 opposite each of the first and second ball land pads 1030a and 1030c. Each of the dummy ball lands 1040 includes a plurality of sub-patterns 1040a, 1040b, 1040c, and 1040d which are disposed surrounding a corresponding one of the openings 1060a and 1060b in a plan view. Vent holes 1042 are disposed between the sub-patterns 1040a, 1040b, 1040c, and 1040d.

A first solder mask pattern 2070a is disposed over the first surface 1015 of the core layer 1000, and the second solder mask pattern 2070b is disposed over the second surface 1020 of the core layer 1000. The first solder mask pattern 2070a is disposed over the first surface 1015 of the core layer 1000 to expose portions of the first circuit interconnection pattern 1030b. The portions of the first circuit interconnection pattern 1030b exposed by the first solder mask pattern 1070a include bonding pads 1031. The second solder mask pattern 2070b is disposed over the second surface 1020 of the core layer 1000 to completely expose the first and second openings 1060a and 1060b and the dummy ball lands 1040.

A solder ball 1095 is formed to fully cover each of the dummy ball lands 1040 completely exposed by the second solder mask pattern 2070b. The solder balls 1095 are formed to fill the openings 1060a and 1060b as well as the vent holes 1042 between the sub-patterns 1040a, 1040b, 1040c, and 1040d. That is, the solder balls 1095 are formed filling the vent holes 1042 and the openings 1060a and 1060b as well as to be formed adhering to the sub-patterns 1040a, 1040b, 1040c, and 1040d. Thus, an adhesion strength between the solder balls 1095 and the ball land pads 1030a and 1030b and dummy ball lands 1040 may be improved.

A semiconductor chip 1080 is attached onto the substrate 1003. The semiconductor chip 1080 includes connection terminals 1085 such as bumps. The connection terminals 1085 of the semiconductor chip 1080 are attached to the bonding pads 1031 of the substrate 1003. A molding resin layer 1090 is disposed on the substrate 1003 to cover the semiconductor chip 1080.

Embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A substrate comprising:
a core layer having a first surface and a second surface which are opposite to each other;
a ball land pad disposed on the first surface of the core layer;
an opening that penetrates the core layer to expose the ball land pad; and
at least one dummy ball land disposed on the second surface of the core layer to surround the opening, the dummy ball land including at least one sub-pattern and at least one vent hole,
wherein the at least one sub-pattern is disposed along a circular line surrounding the opening.

2. The substrate of claim 1, wherein the at least one sub-pattern has a "C"-shaped configuration surrounding the opening.

3. The substrate of claim 1, wherein the at least one dummy ball land includes a first dummy ball land and a second dummy ball land, the second dummy ball land disposed on the second surface of the core layer to surround the first dummy ball land and to be spaced apart from the first dummy ball land,
wherein each of the first and second dummy ball lands includes a plurality of sub-patterns which are separated from each other.

4. The substrate of claim 3, wherein spaces between the plurality of sub-patterns of each of the first and second dummy ball lands correspond to vent holes.

5. The substrate of claim 1, wherein the at least one sub-pattern of the dummy ball land includes a wetting material for solder balls.

6. A semiconductor package comprising;
a substrate comprising:
- a core layer having a first surface and a second surface which are opposite to each other;
- a ball land pad disposed on the first surface of the core layer;
- an opening that penetrates the core layer to expose the ball land pad; and
- at least one dummy ball land disposed on the second surface of the core layer to surround the opening, the dummy ball land including at least one sub-pattern and at least one vent hole;
- a solder mask pattern disposed on the second surface the core layer to expose the opening; and
- a semiconductor chip attached to the substrate and electrically coupled to the ball land pad.

7. The semiconductor package of claim 6, further comprising an external terminal bonded to the ball land pad as well as to the dummy ball land while filling the opening and the at least one vent hole.

8. The semiconductor package of claim 6, wherein the at least one sub-pattern is disposed along a circular line surrounding the opening.

9. The semiconductor package of claim 6,
wherein the at least one dummy ball land includes a first dummy ball land and a second dummy ball land,
wherein the second dummy ball land is disposed on the second surface of the core layer to surround the first dummy ball land; and
wherein the first dummy ball land includes at least one first vent hole, and the second dummy ball land includes at least one second vent hole.

10. The semiconductor package of claim 9, wherein each of the first and second dummy ball lands includes a plurality of sub-patterns, and spaces between the plurality of sub-patterns of said each of the first second dummy ball lands correspond to vent holes.

11. The semiconductor package of claim 9, wherein the substrate further includes external terminals disposed on the first and second dummy ball lands to substantially fill the at least one first vent hole and the at least one second vent hole.

12. The semiconductor package of claim 6, wherein the vent hole penetrates the at least one sub-pattern in a horizontal direction parallel with the second surface of the core layer.

13. The semiconductor package of claim 6, wherein the solder mask pattern covers an outer edge portion of the at least one sub-pattern of the dummy ball land.

14. A method of fabricating a semiconductor package, the method comprising:
providing a substrate including a core layer having a first surface and a second surface opposite to each other, a ball land pad disposed on the first surface of the core layer, an opening penetrating the core layer to expose the ball land pad, and at least one dummy ball land disposed on the second surface to surround the opening, the dummy ball land including at least one sub-pattern and at least one vent hole;
forming a solder mask pattern on the second surface of the core layer to expose the opening;
attaching a semiconductor chip onto the substrate so that the substrate is electrically coupled to the semiconductor chip; and
forming an external terminal on the dummy ball land to fill the opening.

15. The method of claim 14, wherein the external terminal is formed to substantially fill the at least one vent hole of the dummy ball land in addition to the opening.

16. The method of claim 14, wherein the solder mask pattern is formed to cover an outer edge portion of the at least one sub-pattern of the dummy ball land.

17. The method of claim 14, wherein providing the substrate includes:
forming a first conductive layer and a second conductive layer on the first surface and the second surface of the core layer, respectively;
patterning the first conductive layer to form the ball land pad and a circuit interconnection pattern;
patterning the second conductive layer to form the at least one dummy ball land; and
forming the opening that penetrates the core layer to expose the ball land pad.

18. The method of claim 17, wherein the ball land pad is formed to be a portion that extends from an end of the circuit interconnection pattern.

19. The method of claim 17, wherein forming the at least one dummy ball land comprises forming a first dummy ball land and a second dummy ball land, the second dummy ball land being formed to surround the first dummy ball land and to be spaced apart from the first dummy ball land,
wherein each of the first and second dummy ball lands is formed to include a plurality of sub-patterns which are separated from each other.

* * * * *